United States Patent [19]

Abe et al.

[11] Patent Number: 5,252,548

[45] Date of Patent: Oct. 12, 1993

[54] METHOD OF FORMING AN OXIDE SUPERCONDUCTOR/SEMICONDUCTOR JUNCTION

[75] Inventors: Hitoshi Abe; Tomoyuki Yamada, both of Tokyo, Japan

[73] Assignee: Oki Electric Industry Co., Ltd., Tokyo, Japan

[21] Appl. No.: 815,562

[22] Filed: Dec. 26, 1991

Related U.S. Application Data

[63] Continuation of Ser. No. 532,205, Jun. 1, 1990, abandoned.

[30] Foreign Application Priority Data

Jun. 9, 1989 [JP] Japan .................................. 1-145066

[51] Int. Cl.⁵ .............................................. B23B 9/00
[52] U.S. Cl. .................................. 505/1; 505/701; 505/702; 505/729; 505/730; 505/731; 156/603; 156/610
[58] Field of Search ............... 156/603, 610; 505/1, 505/702, 701, 729, 730, 731

[56] References Cited

U.S. PATENT DOCUMENTS

| | | | |
|---|---|---|---|
| 4,837,609 | 6/1989 | Gurvitch et al. | 505/1 |
| 4,892,863 | 1/1990 | Agarwala | 505/1 |
| 4,931,425 | 6/1990 | Kimura | 427/255.3 |
| 4,940,693 | 7/1990 | Shappiro et al. | 505/703 |
| 4,959,345 | 9/1990 | Yamazaki | 505/730 |
| 4,968,664 | 11/1990 | Sugihara et al. | 505/701 |
| 4,971,948 | 11/1990 | Dam et al. | 505/728 |
| 4,994,435 | 2/1991 | Shiga et al. | 505/704 |

FOREIGN PATENT DOCUMENTS

0314484  5/1989  European Pat. Off. .

OTHER PUBLICATIONS

Rao, et al., "Molecular beam epitaxial growth of InAs on a TlBaCaCuO superconducting film," *Applied Physics Letter*, 56(5), Jan. 29, 1990, pp. 490-492.

K. Harada, et al., "Y-Ba-Cu-O Thin Film on Si Substrate", *Japanese Journal of Applied Physics*, vol. 27, No. 8, Aug., 1988, pp. L1524-L1526.

A. Mogro-Campero, et al., "Characterization of thin films of Y-Ba-Cu-O on oxidized silicon with a zirconia buffer layer", *Applied Physics Letter*, 52(24), Jun. 13, 1988, pp. 2068-2070.

S. Miura, et al., "Epitaxial Y-Ba-Cu-O films on Si with intermediate layer by rf magnetron sputtering", *Applied Physics Letter*, 53(20), Nov. 14, 1988, pp. 1967-1969.

Otsubo, et al., "Preparation of Ba-Y-Cu-O Superconducting Films by Laser Ablation with and without Laser Irradiation on Growing Surface", *Japanese Journal of Applied Physics*, vol. 27, No. 12, Dec., 1988, pp. L2442-L2444.

*Primary Examiner*—Robert Kunemund
*Attorney, Agent, or Firm*—Edward D. Manzo

[57] ABSTRACT

In a method of forming an oxide superconductor/semiconductor junction between an oxide superconductor and a semiconductor containing bismuth or thallium, an atomic layer of silver of no more than 3 atoms thickness is formed by vapor deposition of silver on the surface of the semiconductor, an atomic layer of bismuth or thallium of no more than 3 atoms thickness is formed by vapor deposition of bismuth or thallium on the silver layer, the double atomic layer consisting of silver and bismuth or of silver and thallium are heated to form a layer wherein the atoms of silver and bismuth or silver and thallium are arranged regularly on the surface of the semiconductor, and the oxide superconductor is formed to a specified thickness on the regularly arranged layer.

22 Claims, 3 Drawing Sheets

METHOD OF FORMING AN OXIDE SUPERCONDUCTOR/SEMICONDUCTOR JUNCTION

This is a continuation of application Ser. No. 07/532,205, filed Jun. 1, 1990, now abandoned.

BACKGROUND OF THE INVENTION

This invention concerns a method of forming an oxide superconductor/semiconductor junction, and in particular, a method of forming an oxide superconductor/semiconductor junction wherein one of the constituent elements of the oxide superconductor is bismuth (referred to hereafter as Bi) or thallium (referred to hereafter as Tl), and the semiconductor is an elemental semiconductor or a Group III-V or Group II-VI compound semiconductor.

Conventionally, thin films of high temperature oxide superconductors such as $Y_1Ba_2Cu_3O_x$, $Bi_2(Sr, Ca)_3Cu_2O_y$, or $Tl_2(Ba, Ca)_3Cu_2O_z$ were formed on a substrate such as silicon (Si) by first forming a buffer layer of a substance such as MgO, $ZrO_2$, or $BaTiO_3$ (or $SrTiO_3$)/$MgAl_2O_4$ on a Si substrate, and then growing a thin film of the oxide superconductor on the buffer layer.

Methods where MgO or $ZrO_2$ are used as the buffer layer are disclosed, for example, in the following references:

Reference 1: Japanese Journal of Applied Physics, 27 [8] (August 1988), p. L1524–1526.

Reference 2: Appl. Phys. Lett.: American Institute of Physics, 52 [24] (Jun. 13, 1988), p. 2068–2070.

A method where $BaTiO_3$ (or $SrTiO_3$)/$MgAl_2O_4$ is used as said buffer layer is disclosed in the following reference:

Reference 3: Appl. Phys. Lett.: American Institute of Physics, 53 [20] (Nov. 14, 1988), p. 1967–1969.

In addition to these methods where a junction between a high temperature oxide superconductor and a semiconductor is made using a suitable buffer layer, the oxide superconductor may be deposited directly on the Si or other substrate as disclosed in Reference 4.

Reference 4: Japanese Journal of Applied Physics, 27 [12] (December 1988), p. L2442–2444.

The technique described in this reference is known as laser ablation vapor deposition. It consists of heating and evaporating the bulk oxide superconductor by for example an eximer laser in order to deposit it on the Si or other substrate.

The conventional methods of forming an oxide superconductor/semiconductor junction by means of a buffer layer as described in references 1, 2 and 3, were effective in devices where the thin film of oxide superconductor was used as a superconductor, but they could not be applied in techniques where the interface with the elemental or compound semiconductor was used, as for example in complex superconductor/semiconductor devices such as the superconductor-base transistor disclosed in Japanese Patent Application No. 63-132850 proposed by the applicant of this application. Further, in the laser ablation vapor deposition method described in Reference 4, a bulk material of oxide superconductor is heated and vaporized by the laser. It is thus impossible to impose any conditions on the arrangement of atoms at the interface, and this method cannot therefore be applied to devices, such as for example the above-mentioned complex superconductor/semiconductor devices, which make use of the superconductor/semiconductor interface.

In summary, according to the prior art, when a thin superconducting film was formed by conventional techniques, Si reacted with the elements of the superconductor composition at the interface so that the properties of the film deteriorated, and due to reactions at the interface, the boundary became indistinct. In particular, an element such as Si which is easily oxidized reacted with the oxygen in the high-temperature oxide superconductor when and after the thin film is formed. In other words, as thin films of conventional superconductors were formed by methods such as sputtering, it was impossible to form a junction on a substrate of an elemental semiconductor or a semiconductor of a Group III-V or Group II-VI compound with a satisfactory interface. It was thus not possible to form junctions in superconductor transistors or the like.

SUMMARY OF THE INVENTION

This invention was conceived to overcome the above disadvantages. It aims to provide a method of forming an oxide superconductor/semiconductor junction wherein, during or after the formation of a thin film of high-temperature oxide superconductor containing Bi or Tl upon a substrate of an elemental semiconductor or a Group III-V or Group II-VI compound semiconductor, reactions do not occur at the junction interface and the order of magnitude of the number of atoms in the interface can be strictly controlled. This makes it possible to form, for example, a superconductor-base transistor.

In the method of forming an oxide superconductor/semiconductor junction of this invention, in the formation of a junction between a high-temperature oxide superconductor containing Bi or Tl and an elemental semiconductor or a Group III-V or Group II-VI compound semiconductor, Ag (silver) is first vapor-deposited on the semiconductor surface to a thickness of no more than 3 atoms (about $5 \times 10^{15}$ atoms/cm$^2$), followed by vapor deposition of Bi or Tl also to a thickness of no more than 3 atoms (about $5 \times 10^{15}$ atoms/cm$^2$). The resulting double layer which is no more than 6 atoms thick is then heated so as to cover the semiconductor surface with a layer of regular arrangement of the Ag and Bi or Ag and Tl atoms, and the oxide superconductor containing Bi or Tl is then grown on this layer to a specified thickness to form an oxide superconductor/semiconductor junction.

In this invention, layers comprising no more than 3 atoms deep of Ag and no more than 3 atoms deep of Bi or Tl, which is one of the principal components of an oxide superconductor, are formed on a semiconductor surface in the order Ag followed by Bi or Tl, and is then subjected to heat treatment. After the heat-treatment, a thin film of the oxide superconductor is grown. It is thus possible to strictly control the interface between superconductor and semiconductor at the atomic level. Atomic layers containing a regular arrangement of AgBi or AgTl are obtained at this interface, and a junction is formed with the layers having regularly arranged atoms. Experiments on the I-V characteristics of the semiconductor and thin film of oxide superconductor also confirm the formation of a Schottky junction. If semiconductors with a high impurity concentration are used, therefore, an ohmic junction with low contact resistance can be formed.

BRIEF DESCRIPTION OF THE DRAWINGS

FIG. 2A is a schematic view of vapor-deposited Ag formed on a Si substrate.

FIG. 2B is a schematic view of vapor-deposited Bi formed on vapor-deposited Ag.

FIG. 2C is a schematic view of the regular arrangement of Ag atoms and Bi atoms obtained after heat treatment of the structure of FIG. 2B.

DETAILED DESCRIPTION OF THE PREFERRED EMBODIMENTS

Embodiments of this invention will now be described with reference to the drawings.

Figure 1:
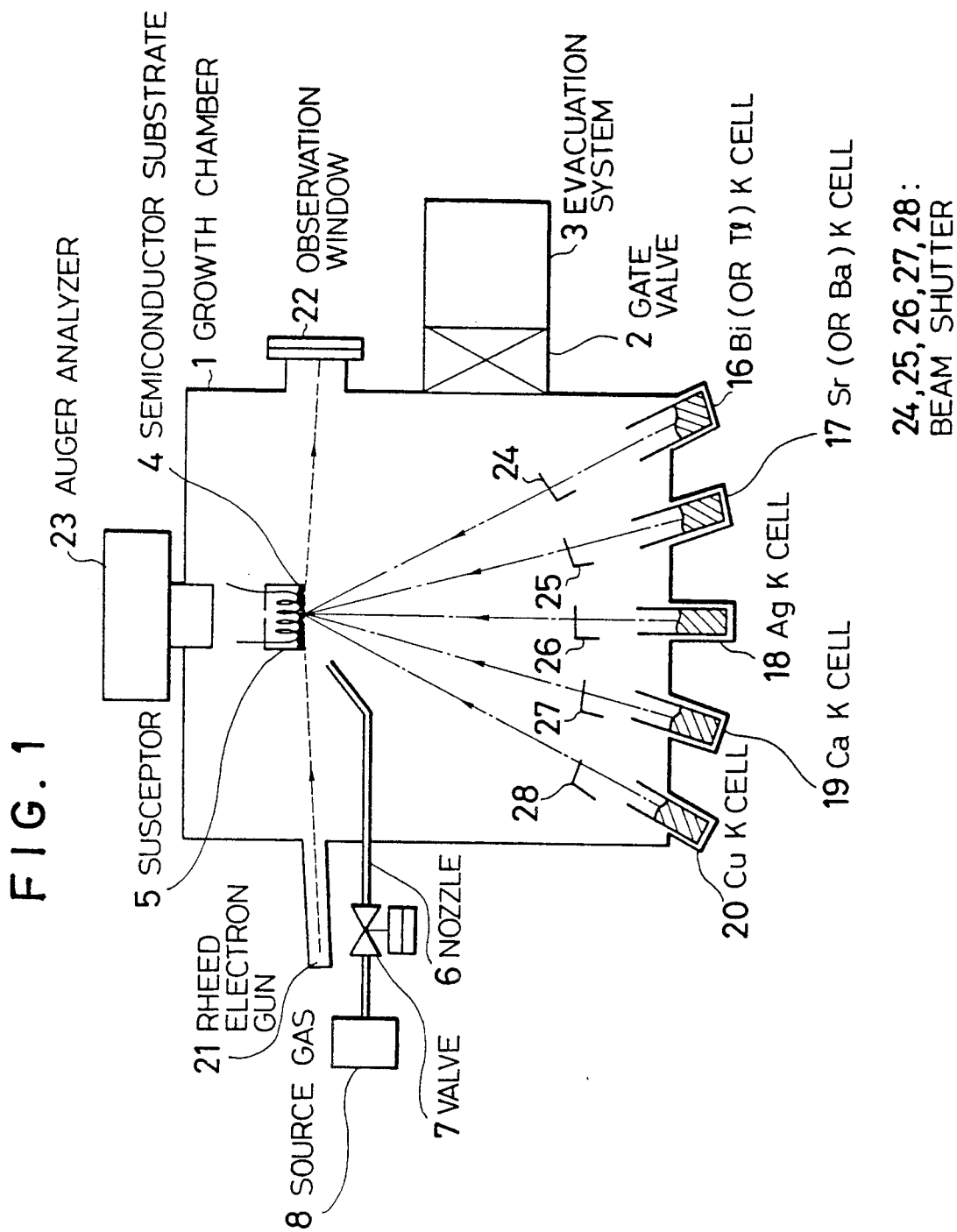
FIG. 1 is a schematic illustration of a junction-forming apparatus required to form an oxide superconductor/semiconductor junction in one embodiment of this invention.

FIG. 1 is a schematic drawing of a junction forming apparatus to form an oxide superconductor/semiconductor junction in one embodiment of this invention. In the FIG., 1 is a growth chamber, 2 is a gate valve for evacuation of chamber 1, and 3 is an evacuation system for evacuating chamber 1 when gate valve 2 is opened. 4 is a semiconductor substrate on which a junction is to be formed, and 5 is a susceptor containing a heating means (e.g. a heater). 6 is a nozzle installed from the outside of growth chamber 1 which projects into the interior of the chamber 1 near semiconductor substrate 4, 7 is a valve installed on nozzle 6, and 8 denotes source gases containing component elements of the oxide superconductor to be grown on semiconductor substrate 4. When the film is grown, source gases 8 are blown into chamber 1 from nozzle 6 through valve 7, and the pressure of source gases 8 is increased locally in the vicinity of the surface of semiconductor substrate 4. Source gases 8 may be introduced independently into chamber 1 from a number of different gas cylinders as required which are not shown in the drawing.

16-20 are Knudsen Cells (abbreviated hereafter as K cells) which evaporate metal elements to be used as components of the junction or oxide superconductor, and deposit them on semiconductor substrate 4, but the heating system is not shown for the sake of simplicity. If a Bi type oxide superconductor/semiconductor junction is to be formed, 16 is a Bi K cell, 17 is a Sr K cell, 18 is a Ag K cell, 19 is a Ca K cell, and 20 is a Cu K cell. In the case of a Tl type oxide superconductor, on the other hand, 16 is a Tl K cell, and 17 is a Ba K cell. Further, if other elements such as Pb are to be added, the number of K cells may be increased according to the desired objective. Further, 24-28 are beam shutters for K cells 16-20, respectively. During the growth of the oxide superconductor film, $O_2$, $N_2O$, $O_3$ or activated $O_2$ are supplied from nozzle 6. 21 is a RHEED (Reflection High-Energy Electron Diffraction) electron gun to investigate the crystalline nature of the film formed on the surface of semiconductor substrate 4, and 22 is a diffraction pattern observation window. Further, 23 is an Auger analyzer which uses high speed electrons as a probe in order to quantitatively measure the amount of vapor-deposition for the formation of the film of the the order of atoms deposited for making a junction on the semiconductor substrate.

The procedure of formation of an oxide superconductor/semiconductor junction will now be described taking as an example the case of a combination of a Si substrate with a Bi-Sr-Ca-Cu-O type superconductor. Firstly, a Si substrate 4 which has been thoroughly cleaned and subjected to surface etching is installed on susceptor 5, and the chamber is evacuated to a very high vacuum of about $10^{-11}$ Torr by evacuation system 3. Si substrate 4 is then heated to 1100° C. or more by the heating system of susceptor 5 to remove oxides from its surface, and after cooling to room temperature, the Auger analyzer 23 and RHEED 21 are used to verify that its surface is clean in terms of the order of magnitude of numbers of atoms. If the surface is thoroughly clean, the output of the Auger analyzer will show no peaks apart from that of Si, and the RHEED reflection diffraction pattern obtained through the observation window 22 will be a $(2 \times 1)$ structural pattern for a Si (100) substrate.

Next, beam shutter 26 is opened, after the Ag K cell 18 has been heated so that Ag atoms are vaporized and sprayed onto Si substrate 4, which has a clean surface prepared as described above, so as to deposit Ag in an amount no more than that corresponding to a layer of 3 atoms thickness (about $5 \times 10^{15}$ atoms/cm$^2$). Beam shutter 26 is then closed. It is desirable that the pressure in growth chamber 1 during the deposition is no greater than $10^{-10}$ Torr. The amount of deposition is measured by Auger analyzer 23.

Beam shutter 24 is opened, after Bi K cell 16 has been heated, so that Bi is deposited in an amount no more than that corresponding to a layer of 3 atoms thickness (about $5 \times 10^{15}$ atoms/cm$^2$), on the layer of Ag having a thickness of no more than 3 atoms. Beam shutter 24 is then closed. In this process also, it is desirable that the pressure in growth chamber 1 is no greater than $10^{-10}$ Torr, and the amount of deposit is measured by Auger analyzer 23. After depositing a double layer of no more than 6 atoms thickness comprising no more than 3 atoms thickness of Ag and Bi respectively, the temperature of Si substrate 4 is raised to 500°-600° C., preferably 500°-550° C., and is maintained at such a raised temperature for about 25 minutes, while observing the RHEED pattern through observation window 22. The pattern suddenly becomes clear, and the vapor-deposited Ag and Bi adsorbed on the surface of Si substrate 4 appear to rearrange as if they had crystallized.

Figure 2A:
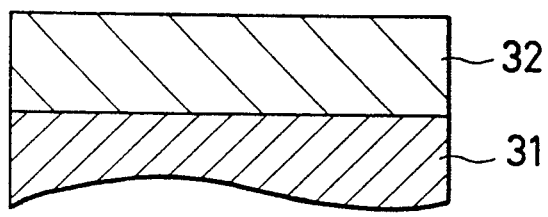
FIG. 2A to FIG. 2C are schematic sectional views showing the vapor deposition process of Ag and Bi on a Si substrate, and the regular arrangement that is obtained after heat treatment.
Figure 2B:
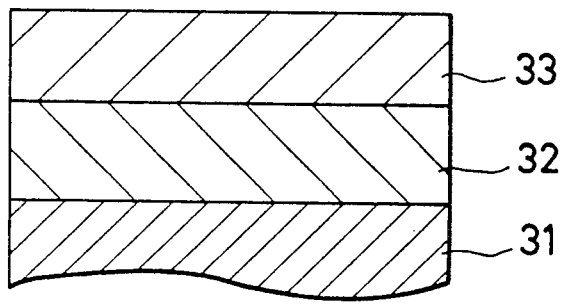
Figure 2C:
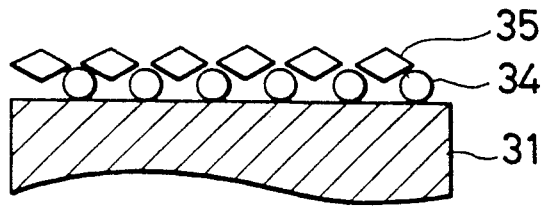

FIG. 2 is a schematic sectional view of the process of vapor deposition of Ag and Bi atoms on the Si substrate and the regular arrangement that is obtained after heat treatment. The amounts of both Ag and Bi atoms are each equivalent to a layer of no more than 3 atoms thickness which corresponds to a deposit of no more than about $5 \times 10^{15}$ atoms/cm$^2$. In FIG. 2, Si substrate 4 of which the surface has been cleaned in the initial cleaning process (see FIG. 1) is indicated as Si substrate 31. FIG. 2A is a schematic view of the case where a deposit of Ag 32 is formed on Si substrate 31 to a thickness of no more than 3 atoms. FIG. 2B is a schematic view of the case where a deposit of Bi 33 is formed on the Ag deposit 32 in FIG. 2A to a thickness of no more than 3 atoms. FIG. 2C shows the regular arrangement of Ag atoms 34 and Bi atoms 35 on Si substrate 31 that is obtained by heating to 500°–550° C. as described in this embodiment.

When the RHEED diffraction patterns were observed through observation window 22, the Ag and Ag/Bi atomic layers shown in FIGS. 2A and 2B were found to be polycrystalline (giving a weak diffraction pattern) or amorphous (giving no diffraction pattern). In comparison, the material subjected to heat treatment to produce the state shown in FIG. 2C gave a strong RHEED diffraction pattern. This confirmed that the surface of Si substrate 31 was completely covered with a regular arrangement of Ag atoms 34 and Bi atoms 35.

The method of forming an oxide superconductor layer will next be described. A Bi type oxide superconductor is formed to a desired thickness on Si substrate 31 in the state shown in FIG. 2C. The procedure for this formation will be explained.

Firstly, the temperature of Si substrate 31 is set to 500°–550° C., the Bi, Sr, Ca and Cu K cells 16, 17, 19 and 20 are heated to the specified temperature, $O_3$ gas is blown onto Si substrate 31 (semiconductor substrate 4 in FIG. 1) from nozzle 6, the beam shutters 24, 25, 27 and 28 are opened, and atomic beams of the respective elements are vapor-deposited on Si substrate 31 simultaneously to grow a Bi type oxide superconductor not shown in the figure. When the oxide layer has reached the desired thickness, the beam shutters are closed, and the heating of Si substrate 31 is stopped. The supply of $O_3$ gas from nozzle 6 is continued until the substrate temperature falls below 200° C. When it has reached room temperature, the supply of $O_3$ gas is stopped and the Si substrate 31 is removed from growth chamber 1. A thin film of a Bi type oxide superconductor is thereby formed on Si substrate 31 with the AgBi (or AgTl) layer, and the formation of the oxide superconductor/semiconductor junction of this invention is complete.

The formation of a junction between a Tl type oxide superconductor and semiconductor is achieved, as shown in the description of the apparatus of FIG. 1, by substituting the Bi of K cell 16 with Tl, and substituting the Sr of K cell 17 with Ba.

In the above embodiment, the case where a Si substrate is used for semiconductor substrate 4 was described. There is however no reason why other semiconductors cannot be used, i.e. elemental semiconductors such as Ge, or Group III–V compound semiconductors and Group II–VI compound semiconductors, and in these cases an oxide superconductor/semiconductor junction is formed which is similar to that in the above embodiment.

As explained in this embodiment, the oxide superconductor/semiconductor junction is formed by vapor deposition in which the order of magnitude of the numbers of atoms is controlled. It will therefore be understood that an essential condition for the success of the technique is that the pressure in chamber 1 where the junction is grown must be a very high vacuum such that the rate of deposition of the metal atoms used is sufficiently higher than the rate of adsorption of residual gas in the vacuum system.

The superconducting properties of the oxide superconductor, and the contact properties of the oxide superconductor/semiconductor junction, obtained by the junction-forming technique of this invention will next be described.

Figure 3:
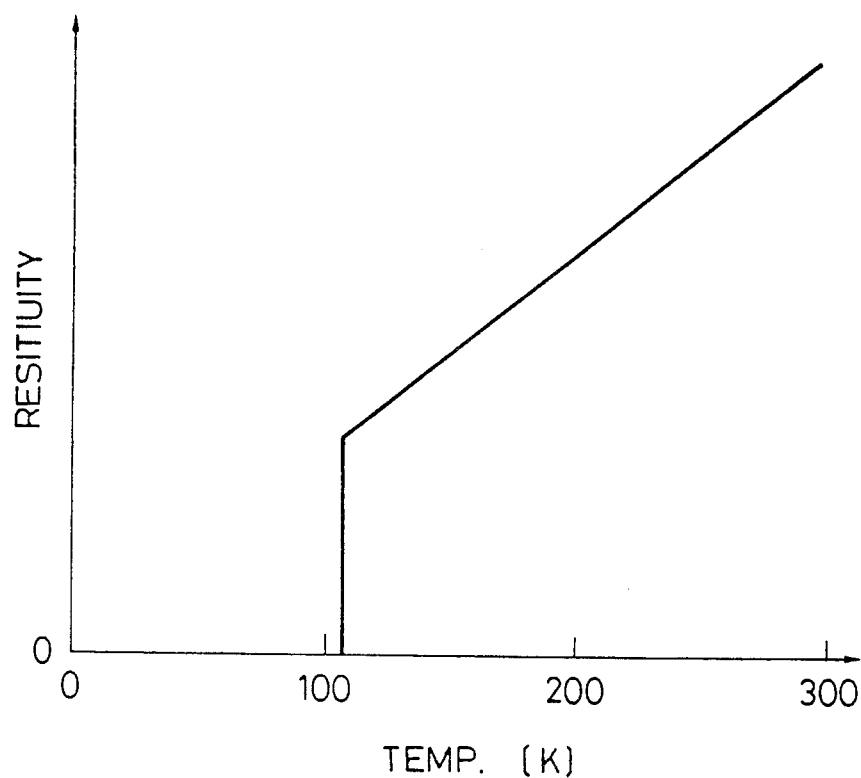
FIG. 3 is a characteristic graph showing the resistivity-temperature dependence of the Bi type oxide superconducting film obtained in this embodiment.

FIG. 3 is a graph of the temperature dependence of the resistivity of a Bi-Sr-Cu-O type superconducting thin film with an oxide superconductor/semiconductor junction formed as in the above embodiment. The horizontal axis shows temperature [K], and the vertical axis is resistivity in arbitrary units ($\rho = \Omega.\text{cm}$). As can be seen from FIG. 3, the temperature at which the resistivity changes abruptly and the critical temperature at which the resistivity is zero practically coincide with one another. This shows that a thin film of an excellent oxide high-temperature superconductor was obtained.

Figure 4:
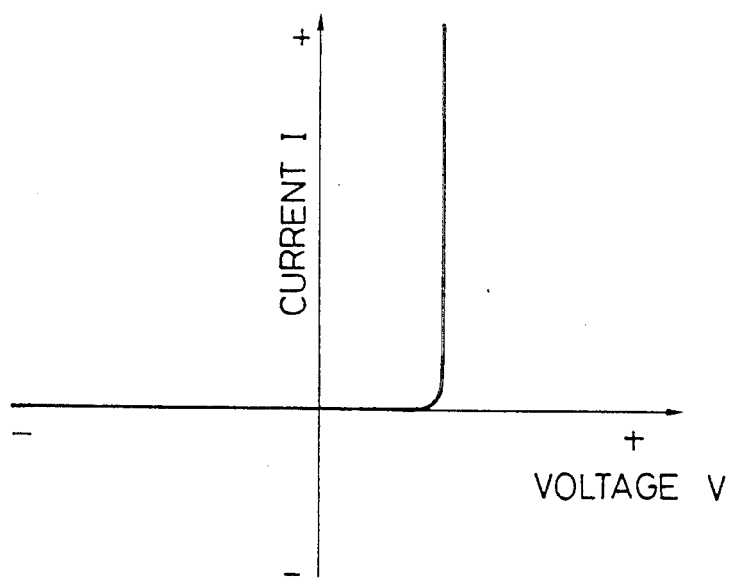
FIG. 4 is a graph showing the I-V characteristics of the Si substrate and superconducting film obtained in this embodiment.

FIG. 4 is a graph showing the I-V characteristics of a thin film of Bi type oxide high-temperature superconductor on a Si substrate formed as in the above embodiment of this invention. In the figure, the horizontal axis is voltage and the vertical axis is current, both in arbitrary units. As can be seen from the figure, the current increases rapidly, and this indicates extremely good Schottky characteristics. If an oxide superconductor/semiconductor junction is formed as in this invention using a Si substrate with a high concentration of impurities, good ohmic properties are obtained, and it will therefore prove extremely useful in application devices (in which the superconductor is employed) such as superconductor-base transistors.

According to this invention, in the formation of a Bi or Tl type oxide superconductor/semiconductor junction, a film of an oxide superconductor is grown on a semiconductor surface via a very thin film comprising a layer of AgBi or AgTl controlled at the atomic level. An oxide superconductor/semiconductor junction with excellent properties is thereby formed. Junctions formed by conventional techniques were always associated with problems such as large current leak and deterioration of interface properties, and this made them very difficult to incorporate in complex semiconductor/superconductor devices, but the application of this junction-forming technique vastly improves their characteristics.

What is claimed is:

1. A method of forming an oxide superconductor/semiconductor comprising bismuth or thallium junction between an oxide superconductor comprising bismuth or thallium and a semiconductor containing bismuth or thallium, comprising the steps of:

forming an atomic layer of silver of no more than 3 atoms thickness by vapor deposition of silver on the surface of said semiconductor;

forming an atomic layer of bismuth or thallium of no more than 3 atoms thickness by vapor deposition of bismuth or thallium on said silver layer;

heating the double atomic layer consisting of said silver and bismuth or of said silver and thallium to form a layer wherein the atoms of said silver and bismuth or silver and thallium are arranged regularly on the surface of said semiconductor; and forming said oxide superconductor to a specified thickness on said regularly arranged layer.

2. A method according to claim 1, wherein said semiconductor is silicon.

3. A method according to claim 1, wherein the deposition of silver is made at a pressure not greater than $10^{-10}$ Torr.

4. A method according to claim 1, wherein the deposition of bismuth or thallium is made at a pressure not greater than $10^{-10}$ Torr.

5. A method according to claim 1, wherein the temperature of said heating is about 500° to 550° C.

6. A method according to claim 5, wherein during said heating the temperature is maintained at 500° to 550° C. for about 25 minutes.

7. A method of forming an oxide superconductor/semiconductor junction between an oxide superconductor containing bismuth or thallium and a semiconductor substrate, comprising the steps of:

forming an atomic layer of silver while controlling the thickness thereof to be no more than three atoms, including vapor depositing silver on a surface of the semiconductor substrate;

forming an atomic layer of bismuth or thallium while controlling the thickness thereof to be no more than three atoms, including vapor depositing bismuth or thallium upon said atomic layer of silver; then rearranging said atom layers to form a composite layer therefrom; and forming an oxide superconductor upon said composite layer.

8. The method of claim 7 wherein said rearranging step comprises heating said layers until said atoms are arranged regularly.

9. The method of claim 7 wherein said rearranging step comprises heating said layers, observing an election diffraction pattern from said layers, and stopping said heating after said diffraction pattern appears as though said atom layers had recrystallized.

10. The method of claim 7 wherein said thickness of silver is 3 atoms.

11. The method of claim 7 wherein said thickness of bismuth or thallium is 3 atoms.

12. The method of claim 9 wherein said thickness of both atomic layers are each 3 atoms thick.

13. The method of claim 9 further comprising evacuating a chamber containing said substrate and performing all of said steps in said evacuated chamber.

14. The method of claim 13 further comprising removing oxides from the substrate surface while said substrate is in said evacuated chamber, prior to said forming steps.

15. A method of forming an oxide superconductor/semiconductor junction between an oxide superconductor comprising bismuth or thallium and a semiconductor comprising the steps of:

forming a first atomic layer of silver of no more than 3 atoms thickness by vapor deposition of silver on the surface of said semiconductor;

forming a second atomic layer of bismuth or thallium by vapor deposition of bismuth or thallium on said silver layer;

heating the first and second atomic layers to form a layer wherein the atoms of said silver and bismuth or said silver and thallium are arranged regularly on the surface of said semiconductor; and forming said oxide superconductor to a specified thickness on said regularly arranged layer.

16. The method of claim 15 wherein said semiconductor comprises silicon.

17. The method of claim 15 wherein said vapor deposition of silver occurs at a pressure not greater than $10^{-10}$ Torr.

18. The method of claim 15 further comprising depositing a layer of bismuth or thallium at a pressure not greater than $10^{-10}$ Torr.

19. The method of claim 15 wherein said heating step occurs at a temperature of about 500° to 550° C.

20. The method of claim 19 wherein said heating at said temperature occurs for a duration of about 25 minutes.

21. A method of forming an oxide superconductor/semiconductor junction between an oxide superconductor comprising bismuth or thallium and a semiconductor comprising the steps of:

forming a first atomic layer of silver by vapor deposition of silver on the surface of said semiconductor;

forming a second atomic layer of bismuth or thallium by vapor deposition of bismuth or thallium on said silver layer;

heating the first and second atomic layers including said silver and bismuth or said silver and thallium to form a layer wherein the atoms of said silver and bismuth or said silver and thallium are arranged regularly on the surface of said semiconductor; and forming said oxide superconductor to a specified thickness on said regularly arranged layer.

22. A method according to claim 21 wherein said semiconductor is silicon.

* * * * *

UNITED STATES PATENT AND TRADEMARK OFFICE
CERTIFICATE OF CORRECTION

PATENT NO. : 5,252,548
DATED : October 12, 1993
INVENTOR(S) : Hitoshi ABE and Tomoyuki YAMADA It is certified that error appears in the above-identified patent and that said Letters Patent is hereby corrected as shown below:

IN THE DRAWINGS:

Sheet 3, Fig. 3, delete "RESITIUITY" and insert --RESISTIVITY--.

IN THE ABSTRACT:

Lines 2-3, delete "an oxide superconductor and a semiconductor containing bismuth or thallium" and insert --an oxide superconductor containing bismuth or thallium and a semiconductor--.

Column 6, line 41, delete "comprising bismuth or thallium";

Column 6, lines 43 and 44, delete "containing bismuth or thallium."

Signed and Sealed this

Twenty-first Day of June, 1994

*Attest:*

BRUCE LEHMAN

*Attesting Officer*　　*Commissioner of Patents and Trademarks*